(12) United States Patent
Tohda

(10) Patent No.: US 6,800,922 B2
(45) Date of Patent: Oct. 5, 2004

(54) SEMICONDUCTOR DEVICE WITH LAYER PEELING RESISTANCE

(75) Inventor: Toshiyuki Tohda, Higashiosaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/055,896

(22) Filed: Jan. 28, 2002

(65) Prior Publication Data
US 2002/0105018 A1 Aug. 8, 2002

(30) Foreign Application Priority Data
Feb. 6, 2001 (JP) ......................................... 2001-029493

(51) Int. Cl.[7] ...................... H01L 27/108; H01L 29/76; H01L 29/94; H01L 31/119; H01L 29/00
(52) U.S. Cl. ........................................ 257/532; 257/306
(58) Field of Search ............................. 257/295–310, 257/532; 438/3, 241–254

(56) References Cited

U.S. PATENT DOCUMENTS 5,245,505 A * 9/1993 Shiga et al. ................ 257/528
5,798,903 A * 8/1998 Dhote et al. ................ 257/295
6,010,969 A * 1/2000 Vaartstra ........................ 438/3
6,472,124 B1 * 10/2002 Chung ........................ 430/314

FOREIGN PATENT DOCUMENTS

EP 0933783 A2 8/1999

* cited by examiner

Primary Examiner—Cuong Nguyen
(74) Attorney, Agent, or Firm—Nixon & Vanderhye, P.C.

(57) ABSTRACT

An object of the present invention is to suppress a layer-peeling phenomenon in a semiconductor device comprising at least a ferroelectric layer and an upper electrode formed thereon while maintaining the electrical properties of the ferroelectric layer. The semiconductor device of the present invention is characterized in that an upper electrode and a ferroelectric layer have a convex region. By this constitution, a layer peeling can be suppressed. In the present invention, one convex region is formed on one layer, but a plurality of convex regions may be formed on one layer. Alternatively, a concave region may be formed in place of the convex region.

10 Claims, 9 Drawing Sheets

SEMICONDUCTOR DEVICE WITH LAYER PEELING RESISTANCE

BACKGROUND OF THE INVENTION

1. Field of the Invention

The present invention provides a capacitor for a ferroelectric memory and the like, and a process for manufacturing the same. More particularly, the present invention relates to a process for manufacturing a semiconductor device which has a capacitor comprising a lower electrode layer, a ferroelectric layer and an upper electric layer, which can suppress a peeling between the layers while maintaining electrical properties of the ferroelectric layer.

2. Prior Art

Ferroelectric memories in the semiconductor field have recently attracted attention. A ferroelectric memory is a next generation memory which is characterized by quick response, random access, multiple rewriting, low power consumption and the like. In the current ferroelectric memory, a transistor is formed, followed by formation of a capacitor comprising an electrode and a ferroelectric layer. These steps are usual processes as described in the Example of JP-A 11-214655. An embodiment of the prior art will be explained below using FIGS. 5A–5G.

First, on an underlying substrate 21 on which a transistor has been formed, an adhesion layer 22 is deposited to 50 nm by sputtering, for example, $TiO_2$, TiN and the like. A lower electrode layer 23 is deposited thereon to 200 nm by sputtering, for example, Pt, Ir, $IrO_3$ and the like. In addition, for example, SBT, PZT and the like is deposited by a Sol-Gel method, MOD, LSMC, sputtering, CVD and the like to 200 nm to form a ferroelectric layer 24 thereon, and which is sintered in an $O_2$ atmosphere. Further, an upper electrode layer 25 is deposited thereon to 100 nm by sputtering, for example, Pt, Ir, $IrO_3$ and the like (FIG. 5A).

After that, a 1.5-μm thick photoresist pattern 26 for processing the upper electrode is formed on the upper electrode layer 25. The upper electrode 25 is then processed by dry etching (FIG. 5B). Dry etching is performed mainly by sputter etching with Ar by highly dissociating a mixture gas of $Cl_2$ and Ar under a high vacuum at 3 mTorr or less, for example, on a high density plasma etching apparatus using an Inductive Coupling Plasma (ICP) and the like. Generally, since vapor pressures of Pt and Ir are very low due to their low reactivity, Pt and Ir dissociated by sputter etching re-adhere to a sidewall of the pattern even after etching. By adding $Cl_2$, $F_2$ and the like to the etching gas, materials adhering on the sidewall are converted to chlorine or fluorine and the like so that they can be removed in the later step of washing.

Then, an etching deposit 27 adhering to the sidewall of the pattern is removed. Subsequently, a remaining resist pattern is removed by using a down flow $O_2$ ashing apparatus and the like (FIG. 5C).

Subsequently, a 2.0-μm thick photoresist pattern 28 for processing a ferroelectric layer is formed on the processed upper electrode layer 25 and the ferroelectric layer 24, and the ferroelectric layer 24 is processes by dry etching (FIG. 5D). Since a ferroelectric layer has similar etching properties to those of Pt, Ir and the like, etching is performed under similar conditions and by a similar mechanism to those for etching the upper electrode layer.

After that, the etching depot-deposit 29 adhering to the pattern side wall is removed by washing. A remaining resist is then removed by down flow $O_2$ ashing and the like (FIG. 5E).

Similarly, a 2.0-μm thick photoresist pattern 30 for processing a ferroelectric layer is formed on the processed upper electrode layer 25, the processed ferroelectric layer 24 and the lower electrode layer 23, and the lower electrode layer 23 is processed by dry etching (FIG. 5F).

Since the lower electrode layer is made from a similar material to that for the upper electrode layer, etching is performed by using a similar condition and mechanism.

After that, the etching deposit 31 adhering to the pattern side wall is removed by washing. A remaining resist is then removed by down flow $O_2$ ashing and the like (FIG. 5G).

When the capacitor shape is formed according to the above steps, the ferroelectric properties are deteriorated by dry etching and washing. Therefore, at the last step, after processing the capacitor, the ferroelectric layer is re-sintered by annealing at a temperature as high as or higher than the carcining (or sintering) temperature at which the ferroelectric layer is formed, to recover its electrical properties. By undergoing the above steps, the capacitor of the ferroelectric layer is formed.

However, this conventional process has a problem in that a layer-peeling phenomenon occurs between an electrode layer and a ferroelectric layer when a capacitor is formed. FIG. 6 illustrates upper electrode layer 25 peeling from ferroelectric layer 24.

The layer-peeling phenomenon occurs when a deposit is washed after etching each of the layers, and in a final annealing. Therefore, it can be considered that a lift-off phenomenon caused by penetration of a solution (for washing a deposit) into a gap between the electrode layer and the ferroelectric layer, and interlayer separation due to a difference in a layer shrinkage rate between the electrode layer and the ferroelectric layer in annealing directly result in the layer peeling.

From an examination of the conventional semiconductor devices, that peeling of the upper electrode layer tends not to occur as the surface morphology of the ferroelectric layer becomes worse. On the other hand, with better surface morphology of the ferroelectric layer (that is, the denser film density) better electric properties result. Therefore, it is currently difficult to improve electrical properties and to decrease film peeling simultaneously, resulting in a big problem.

It has been proposed to attempt prevent the peeling by putting a dielectric layer with a high adherability between the electrode layer and the ferroelectric layer. Yet such proposal has definite disadvantages such as deterioration in electrical properties of the ferroelectric layer, process complication and the like. Thus, an optimal method has not yet been established.

SUMMARY OF THE INVENTION

Thus, an object of the present invention is to suppress the peeling phenomenon in a semiconductor device comprising at least a ferroelectric layer and an upper electrode formed thereon while maintaining the electrical properties of the ferroelectric layer.

According to the present invention, peeling between a first layer and an upper layer formed on the first layer is prevented. Whereas heretofore peeling has been caused by penetration between the layers of a bath or a layer shrinkage in a step of heating, the surface of the first layer is uniquely formed to resist peeling. A since convex or concave region is formed on a surface of a first layer by etching, resulting in an interface between the layers configured to resist the peeling (referred to as an "anchor effect").

DETAILED DESCRIPTION OF THE INVENTION

After a ferroelectric layer is formed, a resist pattern is formed on a region in which the upper electrode is processed and formed. The ferroelectric layer is then etched to make a convex or concave pattern on the surface of the ferroelectric layer. The size of this pattern should be controlled so that the pattern does not lap over outside of the upper electrode pattern in the subsequent step of forming the upper electrode, taking into consideration fluctuations in a pattern line width, an alignment deviation and the like. That is, a line width of the resist pattern for making the pattern is made to be narrower than the minimal line width of the upper electrode by a margin for the alignment deviation.

An etching depth of the ferroelectric layer is adjusted to the thickness of the upper electrode or smaller, since when the etching depth is larger than the thickness of the upper electrode, the upper electrode can not be sputtered successfully, and the etching depth of the ferroelectric layer is adjusted to half of the thickness of the upper electrode or larger in order to exhibit the anchor effect. Further, from the viewpoint of the electrical properties of the ferroelectric layer, it is required that the etching depth of the ferroelectric layer is adjusted to half of its thickness or smaller.

After etching the ferroelectric layer, a deposit and the remaining resist layer are removed by washing and ashing and, then, an upper electrode is formed by sputtering. By carrying out subsequent processes after the formation of the upper electrode, peeling can be prevented due to the anchor effect as compared with the case where the upper electrode attaches a smooth ferroelectric layer. The above-mentioned means can be applied to an interface between the lower electrode and the ferroelectric layer to obtain the anchor effect.

EXAMPLE

The present invention will be explained in detail based on the following Examples.

Figure 1:
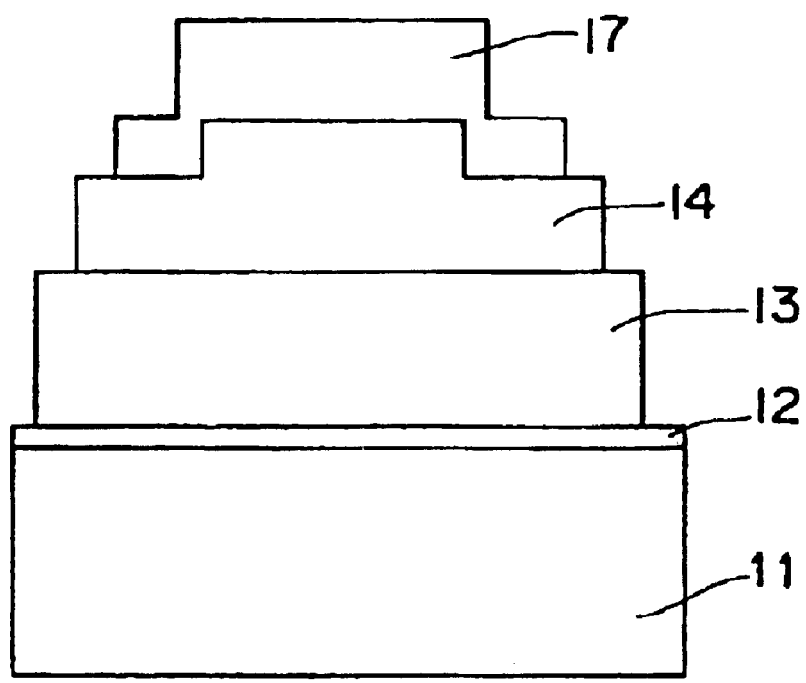
FIG. 1 is a cross-sectional view illustrating a semiconductor device of an embodiment according to the present invention.

A semiconductor device according to the Example of the present invention is shown in FIG. 1. As shown in FIG. 1, the semiconductor device of the present invention is characterized in that an upper electrode 17 and a ferroelectric layer 14 have a convex region. By this constitution, a layer peeling can be suppressed. In this Example, one convex region is formed on one layer, but a plurality of convex regions may be formed on one layer. Alternatively, a concave region may be formed in place of the convex region.

FIGS. 2A–2K are schematic illustrations showing procedures for manufacturing the semiconductor device shown in FIG. 1.

First, on a semiconductor flat substrate 11 on which a transistor is formed and which is covered with an insulation layer, an adhesion layer 12 is deposited to 50 nm, for example, by sputtering $TiO_2$, TiN, $Al_2O_3$, TaSiN and the like. These layers may also be obtained by forming a Ti, Al, TaSi layer and the like by sputtering, and oxidizing or nitridizing.

Figure 2A:
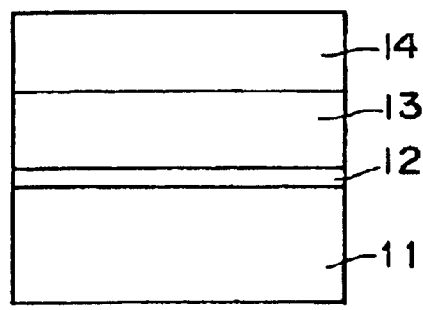
FIGS. 2A–2K are cross-sectional views illustrating steps of manufacturing a semiconductor device of an embodiment according to the present invention.

A lower electrode layer 13 is deposited thereon to 200 nm, for example, by sputtering Pt, Ir, $IrO_3$ and the like. A ferroelectric layer 14 having a thickness of 200 nm is formed by repeating a step of coating, for example, $SrBi_2Ta_2O_9$ (SBT) by a metal organic deposition (MOD) method and a step of calcining it under an oxygen atmosphere for 30 minutes or longer at 650° C. or higher (FIG. 2A). A method of forming a ferroelectric layer other than MOD includes a sol-gel process, a liquid source misted chemical vapor deposition (LSMCVD), sputtering, a chemical vapor deposition process (CVD) and the like.

Figure 2B:
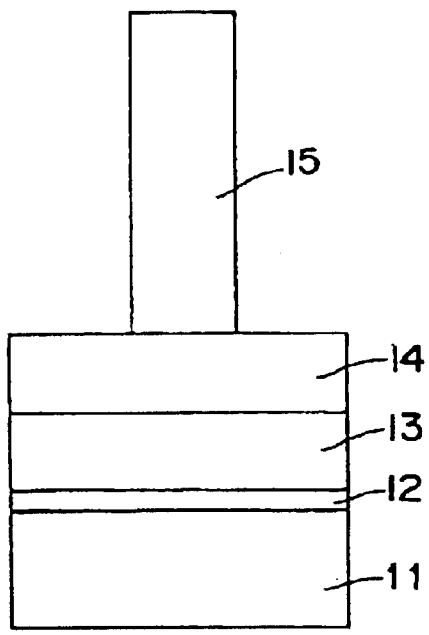

After that, a photoresist is applied on the ferroelectric layer 14 at a thickness of 2 $\mu$m by spin-coating. Then, a photoreticle for fabricating the upper electrode is used and its alignment is adjusted to a region where an upper electrode is formed in a subsequent step. A resist pattern 15 is formed in the steps of exposing and developing (FIG. 2B). The pattern size is smaller than the minimum value of the upper electrode size by a margin for an alignment shift. That is, if a specification for the upper electrode size is within 1.0 $\mu$m±0.1 $\mu$m and that for the alignment shift is 0.2 $\mu$m, the specification for the resist patter size is then within 0.7 $\mu$m.

Figure 2C:
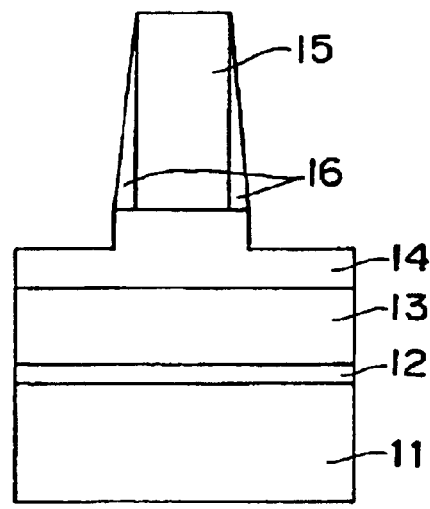

Subsequently, the resist pattern 15 is used as a mask to etch the ferroelectric layer 14 (FIG. 2C). As etching conditions, for example, a high density plasma ICP etcher is used and the settings are as follows: Source power 2000 W; Bias power 500 W; Pressure 3 mTorr; $Cl_2$/Ar flow rate 30/90 sccm; and Etching depth 50 nm or greater and below 100 nm.

Figure 2D:
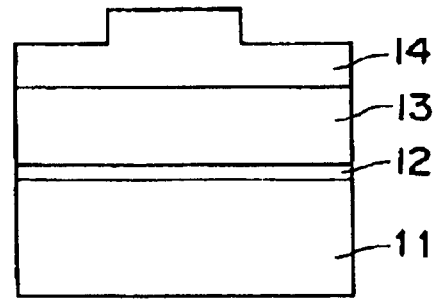

After etching, an etching deposit 16 adhering to the pattern sidewall is removed by washing (e.g., by dipping into 10% concentration hydrochloric acid for 30 seconds). The remaining resist pattern 15 is then removed by ashing (e.g., on a microwave down flow ashing apparatus: Microwave power 1000 W; Wafer temperature 250 C; $O_2$ flow rate 1000 sccm; Treatment time 3 minutes) (FIG. 2D).

Figure 2E:
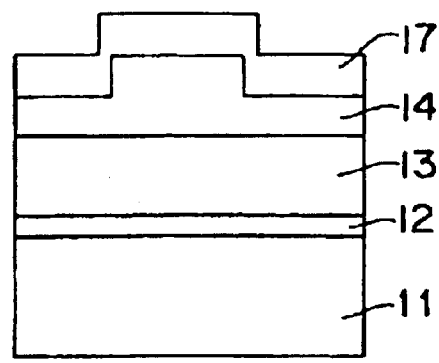

An upper electrode layer 17 is formed on the ferroelectric layer 14 thus fabricated by depositing, for example, Pt, Ir, $IrO_3$ and the like at a thickness of 100 nm by a conventional method such as sputtering (FIG. 2E).

Figure 2G:
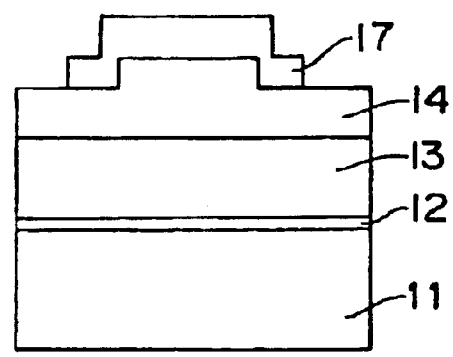
Figure 2F:
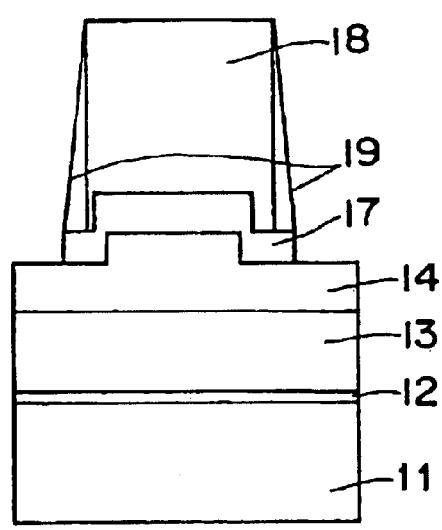

Next, a photoresist is applied on the upper electrode 17 at a thickness of 1.5 $\mu$m by spin-coating. Then, a photoreticle for fabricating the upper electrode is used to expose and develop the photoresist in order to form a resist pattern 18. Subsequently, the resist pattern 18 is used as a mask to etch the upper electrode layer 17 (FIG. 2F). As etching conditions, for example, a high density plasma ICP etcher is used and the settings are as follows: Source power 2000 W; Bias power 500 W; Pressure 3 mTorr; $Cl_2$/Ar flow rate 30/90 sccm; and Etching depth 115 nm (15% overetching based on the thickness of the upper electrode with considering a thickness fluctuation 10% and a etching rate fluctuation 10%).

After etching, an etching deposit 19 adhering to the pattern sidewall is removed by washing (e.g., by dipping into 10% concentration hydrochloric acid for 30 seconds). The remaining resist pattern 18 is then removed by ashing (e.g., on a microwave down flow ashing apparatus: Microwave power 1000 W; Wafer temperature 250 C; $O_2$ flow rate 1000 sccm; Treatment time 3 minutes) (FIG. 2G).

Figure 2H:
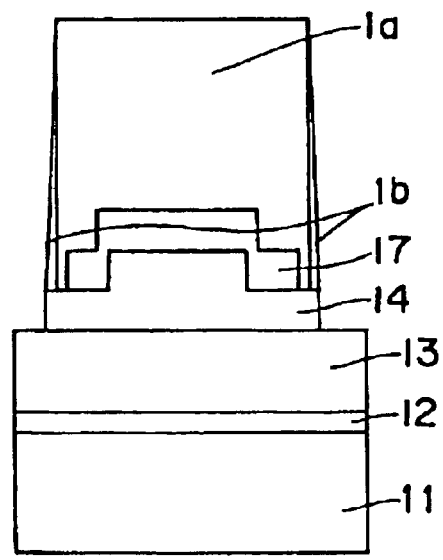

Next, a photoresist is applied at a thickness of 1.5 μm by spin-coating. Then, a reticle for fabricating the ferroelectric layer is used to expose and develop the photoresist in order to form a resist pattern 1a. Subsequently, the resist pattern 1a is used as a mask to etch the ferroelectric layer 14 (FIG. 2H). As etching conditions, for example, a high density plasma ICP etcher is used and the settings are as follows: Source power 2000 W; Bias power 500 W; Pressure 3 mTorr; $Cl_2$/Ar flow rate 30/90 sccm; and Etching depth 115% based on the thickness of the remaining ferroelectric layer.

Figure 2I:
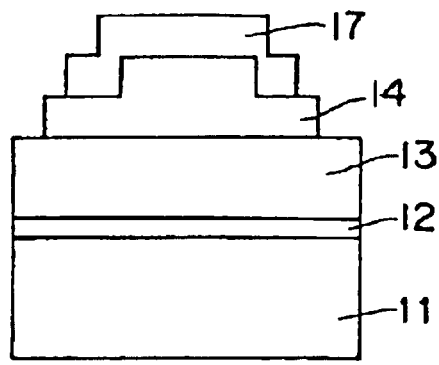

After etching, an etching deposit 1b adhering to the pattern sidewall is removed by washing (e.g., by dipping into 10% concentration hydrochloric acid 30 seconds). The remaining resist pattern 1a is then removed by ashing (e.g., on a microwave down flow ashing apparatus: Microwave power 1000 W; Wafer temperature 250 C; $O_2$ flow rate 1000 sccm; Treatment time 3 minutes) (FIG. 2I).

Figure 2K:
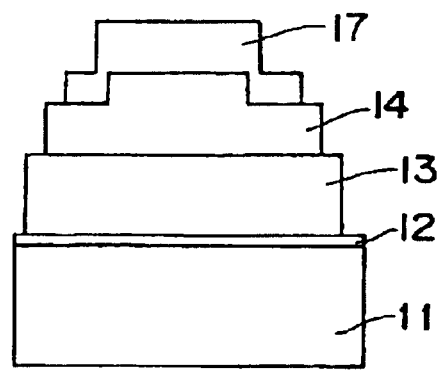
Figure 2J:
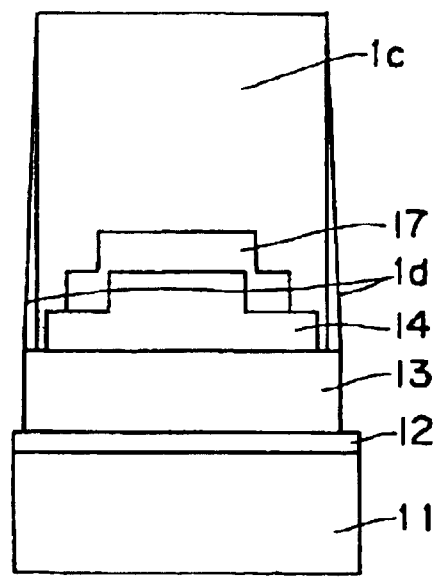

Next, a photoresist is applied thereon at a thickness of 2.0 μm by spin-coating. Then, a photoreticle for fabricating the lower electrode is used to expose and develop the photoresist in order to form a resist pattern 1c. Subsequently, the resist pattern 1c is used as a mask to etch the lower electrode layer 13 (FIG. 2J). As etching conditions, for example, a high density plasma ICP etcher is used and the settings are as follows: Source power 2000 W; Bias power 500 W; Pressure 3 mTorr; $Cl_2$/Ar flow rate 30/90 sccm; and Etching depth 230 nm (15% overetching based on the thickness of the upper electrode with considering a thickness fluctuation 10% and a etching rate fluctuation 10%).

After etching, an etching deposit 1d adhering to the pattern sidewall is removed by washing (e.g., by dipping into 10% concentration hydrochloric acid 30 seconds). The remaining resist pattern 1c is then removed by ashing (e.g., on a microwave down flow ashing apparatus: Microwave power 1000 W; Wafer temperature 250 C; $O_2$ flow rate 1000 sccm; Treatment time 3 minutes) (FIG. 2K).

Finally, in order to recover electrical properties of the ferroelectric layer damaged by etching, washing and ashing, an annealing operation is performed, for example, under a $N_2$ atmosphere at 650° C. for 30 minutes.

A semiconductor device finally obtained shows high electrical performance. In addition, occurrence of peeling was not observed.

Figure 3:
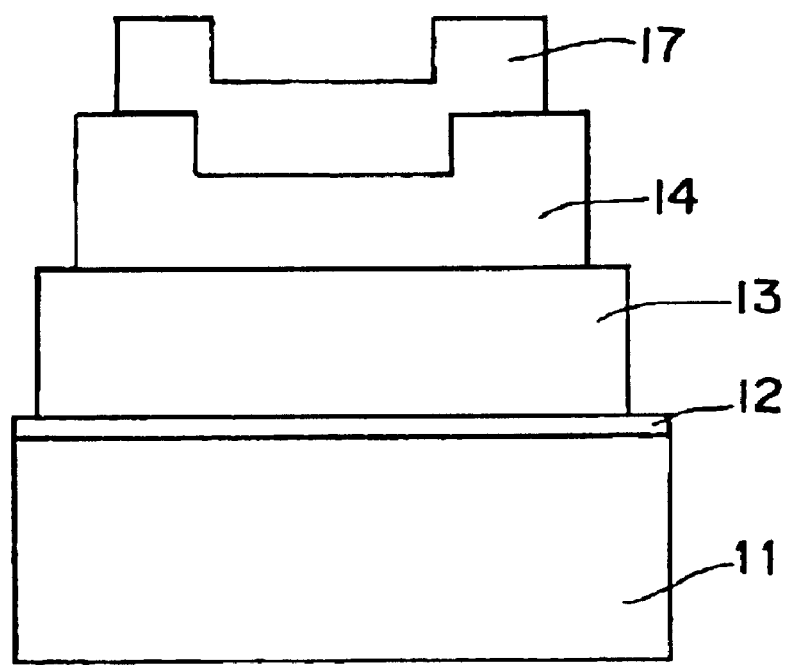
FIG. 3 is a cross-sectional view illustrating a semiconductor device of another embodiment according to the present invention.

FIG. 2A–FIG. 2J, previously described, illustrate a semiconductor device with a convex region provided on the upper surface of the ferroelectric layer. It has previously been mentioned that the upper surface of the ferroelectric layer can have a convex or concave region. Accordingly, FIG. 3 shows another embodiment in which the upper surface of the ferroelectric layer 14 has a concave region.

Figure 4:
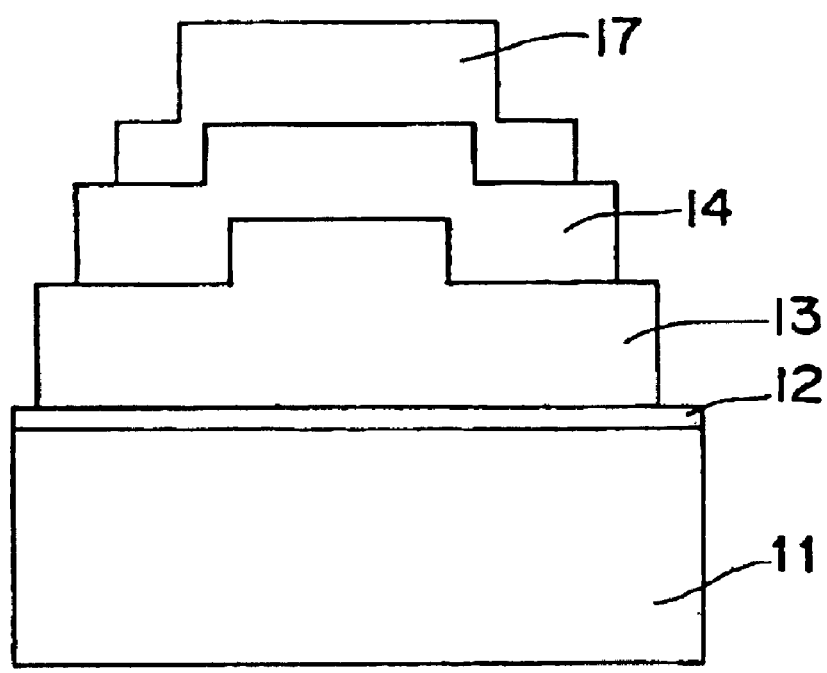
FIG. 4 is a cross-sectional view illustrating a semiconductor of a further embodiment according to the present invention.
Figure 5A:
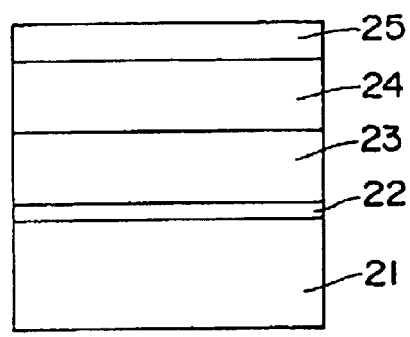
FIGS. 5A–5G are cross-sectional views illustrating steps of manufacturing a semiconductor device according to a conventional technique.
Figure 5C:
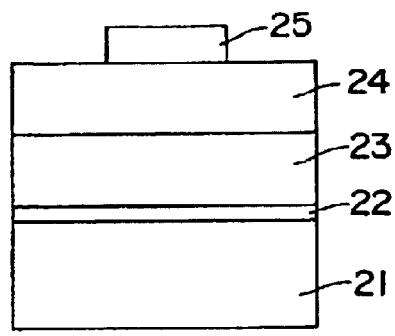
Figure 5B:
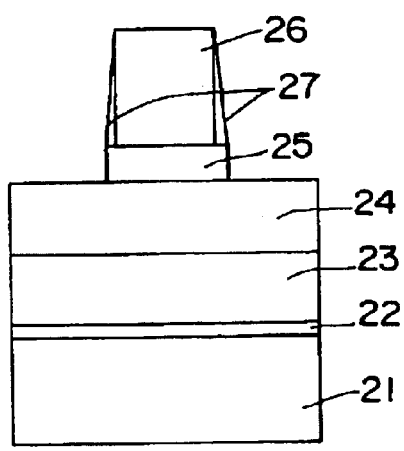
Figure 5D:
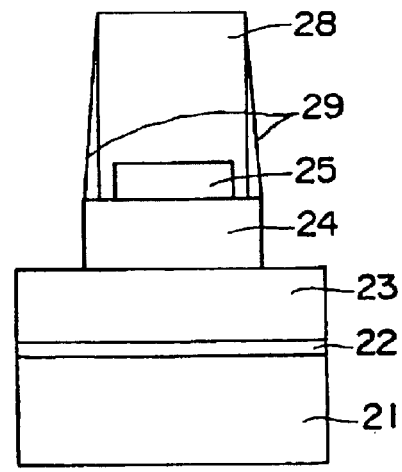
Figure 5E:
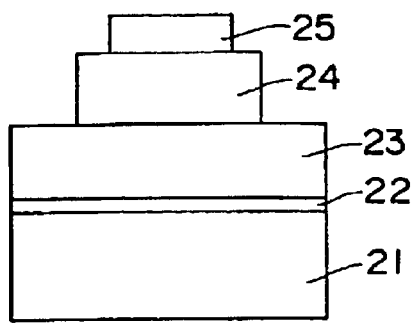
Figure 5G:
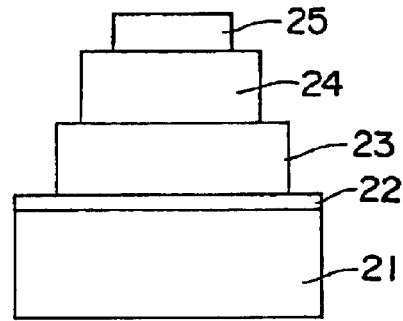
Figure 5F:
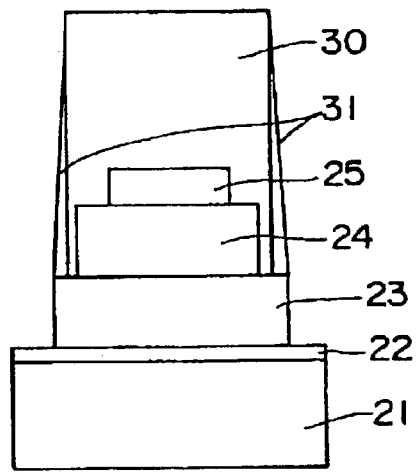
Figure 6:
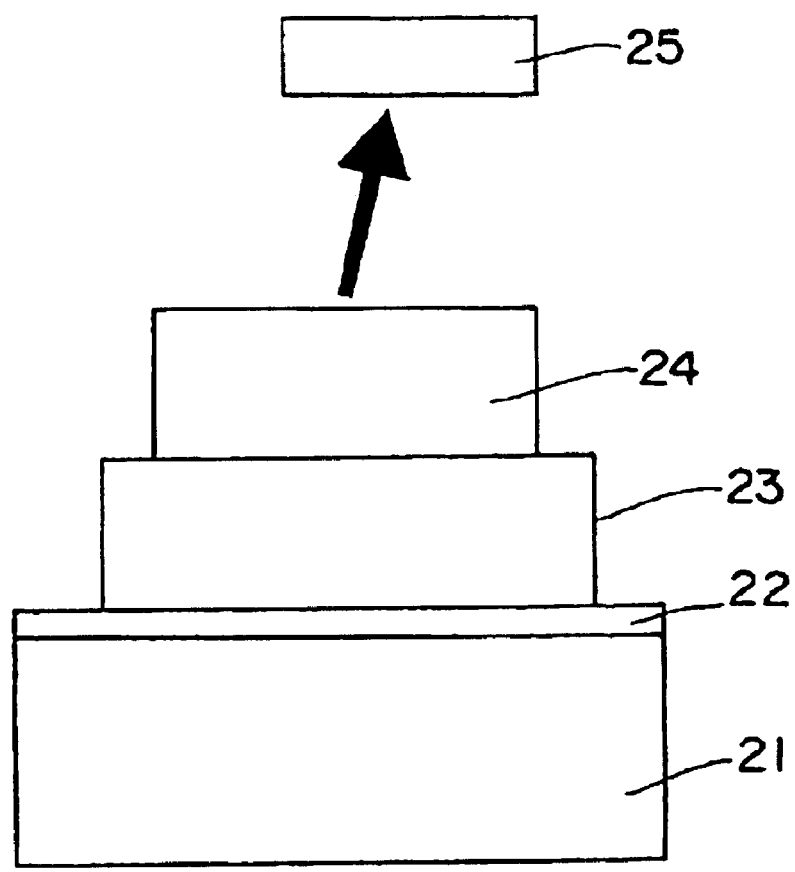
FIG. 6 is a schematic illustration showing film peeling which occurs in a conventional semiconductor device.

FIG. 4 shows a further embodiment in which a convex or concave region is also formed on the upper surface of the lower electrode. The convex or concave surface formed of the ferroelectric layer is thoroughly covered with the upper electric layer, and the convex or concave region formed on the upper surface of the lower electrode layer is thoroughly covered with the ferroelectric layer.

According to the present invention, a layer peeling, which occurs in a conventional process for fabricating a ferroelectric capacitor, can be effectively prevented.

What we claimed are:

1. A semiconductor device, which comprises a capacitor on a semiconductor substrate, said capacitor comprising a lower electrode layer, a ferroelectric layer and an upper electrode layer, wherein a convex or concave region is formed on an tipper surface of the ferroelectric layer, and in upper surface of the semiconductor substrate on which the capacitor is formed being flat, wherein a height or a depth of the convex or concave region formed on the upper surface of the ferroelectric layer is not greater than half a thickness of the ferroelectric layer, and is at least half a thickness of the upper electrode layer.

2. The semiconductor device according to claim 1, wherein the convex or concave region formed on the upper surface of the ferroelectric layer is thoroughly covered with the upper electrode layer.

3. The semiconductor device according to claim 1, wherein a convex or concave region is formed also on the upper surface of the lower electrode layer.

4. The semiconductor device according to claim 3, wherein the convex or concave region formed on the upper surface of the ferroelectric layer is thoroughly covered with the upper electric layer, and the convex or concave region formed on the upper surface of the lower electrode layer is thoroughly covered with the ferroelectric layer.

5. The semiconductor device according to claim 3, wherein a height or a depth of the convex or concave region formed on the upper surface of the lower electrode layer is not greater than half a thickness of the lower electrode layer, and is at least half a thickness of the ferroelectric layer.

6. A semiconductor device, which comprises a capacitor comprising a lower electrode layer, a ferroelectric layer and an upper electrode layer, the ferroelectric layer having a ferroelectric layer upper surface and the upper electrode having an upper electrode upper surface, wherein a convex or concave region is formed on the upper surface of the ferroelectric layer in a manner such that a non-smooth region on the ferroelectric layer upper surface is not aligned, in a direction perpendicular to a thickness of the ferroelectric layer, with a non-smooth region on the upper electrode upper surface, wherein a height or a depth of the convex or concave region formed on the upper surface of the ferroelectric layer is not greater than half a thickness of the ferroelectric layer, and is at least half a thickness of the upper electrode layer.

7. The semiconductor device according to claim 6, wherein the convex or concave region formed on the upper surface of the ferroelectric layer is thoroughly covered with the upper electrode layer.

8. The semiconductor device according to claim 6, wherein a convex or concave region is formed also on the upper surface of the lower electrode layer.

9. The semiconductor device according to claim 8, wherein the convex or concave region formed on the upper surface of the ferroelectric layer is thoroughly covered with the upper electric layer, and the convex or concave region formed on the upper surface of the lower electrode layer is thoroughly covered with the ferroelectric layer.

10. The semiconductor device according to claim 8, wherein a height or a depth of the convex or concave region formed on the upper surface of the lower electrode layer is not greater than half a thickness of the lower electrode layer, and is at least half a thickness of the ferroelectric layer.

\* \* \* \* \*